United States Patent
Veith et al.

(10) Patent No.: US 7,610,178 B2
(45) Date of Patent: Oct. 27, 2009

(54) NOISE REDUCTION FILTER FOR TRIGGER CIRCUIT

(75) Inventors: Kristie Veith, Portland, OR (US); Kenneth P. Dobyns, Beaverton, OR (US); Terrance R. Beale, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/781,432

(22) Filed: Jul. 23, 2007

(65) Prior Publication Data

US 2008/0177508 A1   Jul. 24, 2008

Related U.S. Application Data

(60) Provisional application No. 60/835,276, filed on Aug. 2, 2006.

(51) Int. Cl.
*H04B 15/00* (2006.01)
*G01R 19/00* (2006.01)

(52) U.S. Cl. .................................... 702/191; 324/76.11

(58) Field of Classification Search .................. 702/66, 702/69, 74, 190, 191; 324/76.11, 76.12
See application file for complete search history.

(56) References Cited

U.S. PATENT DOCUMENTS

| | | | |
|---|---|---|---|
| 4,823,076 A | 4/1989 | Haines et al. | |
| 4,888,588 A | 12/1989 | Castagnozzi | |
| 5,184,062 A | 2/1993 | Ladwig | |
| 5,375,067 A | 12/1994 | Berchin | |
| 5,414,635 A | 5/1995 | Ohta | |
| 5,438,531 A | 8/1995 | Shank | |
| 5,930,745 A | 7/1999 | Swift | |
| 5,978,742 A | 11/1999 | Pickerd | |
| 6,279,130 B1 | 8/2001 | Moser | |

(Continued)

FOREIGN PATENT DOCUMENTS

GB   2224869   5/1990

(Continued)

OTHER PUBLICATIONS

"Digital Trigger Ciruit with Excellent Noise Suppression", by W. Van Driessche and Gullentops, Rev. Sci. Instrum., vol. 46, No. 12, Dec. 1975, Copyright 1975, by the American Institute of Physics; pp. 1659-1662.

(Continued)

*Primary Examiner*—Bryan Bui
(74) *Attorney, Agent, or Firm*—Francis I. Gray; Thomas F. Lenihac (57) ABSTRACT

A noise rejection filter for a trigger circuit uses an algorithm that updates the filter output monotonically so long as the signal slope remains unchanged, maintains the filter output at a constant level when the signal slope changes but the difference between the sample value and the filter output is less than or equal to a hysteresis value, and changes the signal slope while updating the filter output when the difference is greater than the hysteresis value. This maintains the peaks of the input signal at the filter output. The noise rejection filter may be used in a trigger circuit prior to a comparator so that the trigger signal from the comparator accurately reflects the signal pulse width at a desired trigger level and trigger events are detected when the desired trigger level is near the peaks of the input signal.

10 Claims, 6 Drawing Sheets

U.S. PATENT DOCUMENTS

| | | |
|---|---|---|
| 6,615,148 B2 | 9/2003 | Pickerd |
| 6,621,913 B1 * | 9/2003 | de Vries ............... 382/100 |
| 6,753,677 B1 | 6/2004 | Weller et al. |
| 6,760,673 B2 | 7/2004 | Genther et al. |
| 6,892,150 B2 | 5/2005 | Pickerd |
| 6,915,218 B2 | 7/2005 | Pickerd |
| 6,970,118 B2 | 11/2005 | Regier |
| 7,034,517 B2 | 4/2006 | Newcombe |
| 7,072,785 B2 | 7/2006 | De Lacy et al. |
| 7,072,804 B2 * | 7/2006 | Weller ................. 702/190 |
| 7,110,898 B2 | 9/2006 | Montijo et al. |
| 7,191,079 B2 | 3/2007 | Smith et al. |
| 7,219,037 B2 | 5/2007 | Pupalaikis et al. |
| 2002/0171408 A1 | 11/2002 | Hansen |
| 2004/0119620 A1 | 6/2004 | Tran et al. |
| 2004/0236527 A1 | 11/2004 | Felps |
| 2005/0246113 A1 | 11/2005 | Montijo |
| 2006/0015862 A1 | 1/2006 | Odom et al. |

OTHER PUBLICATIONS

Precision Digital Oscilloscopes and Waveform Recorders, by James L. Sorden, Hewlett-Packard Journal, Feb. 1988, pp. 6-11, and 14.

* cited by examiner

NOISE REDUCTION FILTER FOR TRIGGER CIRCUIT

CROSS-REFERENCE TO RELATED APPLICATIONS

The present non-provisional application claims the filing date of provisional U.S. Patent Application Ser. No. 60/835,276 filed Aug. 2, 2006, which provisional application is hereby explicitly abandoned.

BACKGROUND OF THE INVENTION

The present invention relates to trigger circuits for triggering, for example, test and measurement instruments to acquire data from an input signal, and relates more particularly to a noise rejection filter for a trigger circuit that provides improved noise rejection for more accurate triggering.

U.S. Pat. No. 7,072,804, issued Jul. 4, 2006 to Dennis J. Weller and entitled "Digital Trigger Filter for a Real Time Digital Oscilloscope", describes a digital trigger circuit that includes a digital trigger filter which generates high frequency rejection, low frequency rejection, AC and DC trigger signals. The digital trigger filter uses two Infinite Impulse Response (IIR) filters with taps that provide the trigger signal outputs needed for high and low frequency rejection in response to a digitized input signal. The AC trigger signal is produced by subtracting the output of the second IIR filter from the digitized input signal, and the DC trigger signal is simply the digitized input signal. A multiplexer selects one of the trigger signals for input to a digital trigger comparator that uses two levels for comparison with the selected trigger signal, the difference ($\Delta V$) between the two levels representing hysteresis. The comparison results are processed by a state machine that determines whether a trigger event has occurred. Unfortunately a digital comparator with hysteresis waits until the input trigger signal has passed above or below both levels (depending upon whether triggering is on the rising or falling edge of a signal) so that it doesn't mistakenly trigger on noise. When the state machine is set up for pulse width triggering, this may result in an error since the measured width from the above the high level to below the low level may not accurately reflect the pulse width at a desired trigger level. Also, when using a traditional comparator with hysteresis, rising edge triggers stop occurring when the trigger level is near the minimum peak value for the digitized input signal, and falling edge triggers stop occurring when the trigger level is near the maximum peak value for the digitized input signal.

An article by W. Van Driessche and C. Gullentops in the Review of Scientific Instruments, Vol. 46, No. 12, December 1975, pgs. 1659-1661 entitled "Digital Trigger Circuit with Excellent Noise Suppression" uses a pseudo filter to process a digitized input signal. The output from the pseudo filter is compared with each new sample of the digitized input signal. If the difference between the input and output of the pseudo filter is less than or equal to a hysteresis amount ($\Delta V$), the output register of the pseudo filter is left unaltered. However if the difference is larger than $\Delta V$, the output is set to a new value equal to the input signal minus $\Delta V$ for increasing signals or plus $\Delta V$ for decreasing signals. The output from the pseudo filter is compared with a selected trigger level by a digital comparator. The output of the digital comparator is passed through a slope control circuit before being applied to a trigger multivibrator to generate the trigger signal on the desired slope of the input signal. A disadvantage of the Driessche et al noise suppression system is that it knocks the peaks off of the digitized input signal, which causes triggering to stop when the trigger level is near either the minimum or maximum peak value for the digitized input signal.

Therefore what is desired is a trigger system with noise rejection that provides a more accurate representation of the input signal for triggering while providing a more accurate representation of pulse width at a desired trigger level.

SUMMARY OF THE INVENTION

Accordingly, the present invention provides a noise rejection filter for a digital trigger circuit, useful in a test and measurement instrument, that provides high and low frequency rejection while preserving signal pulse width at a desired trigger level and preserving triggering at signal peaks. Whether implemented by processing samples of an input sampled signal serially or in groups of samples for higher speed applications, the algorithm for the noise rejection filter compares each sample with the filter output to determine (i) whether there is a change in slope direction and (ii) whether the difference between the sample and the filter output is greater than a hysteresis value. If there is no change in slope, the sample value replaces the filter output value as the new filter output. If there is a change in slope, but the difference is less than or equal to the hysteresis value, the filter output remains unchanged. If there is a change in slope and the difference is greater than the hysteresis value, then the slope direction is changed while the filter output is updated by the sample value. In a trigger circuit the input sampled signal is selected from different filtered versions of a sampled signal. The selected signal is filtered by the noise rejection filter to produce a filtered trigger signal. The filtered trigger signal is then input to a comparator for comparison with a desired trigger level to generate a trigger output.

The objects, advantages and other novel features of the present invention are apparent from the following detailed description when read in conjunction with the appended claims and attached drawing.

DETAILED DESCRIPTION OF THE EMBODIMENTS

Figure 1:
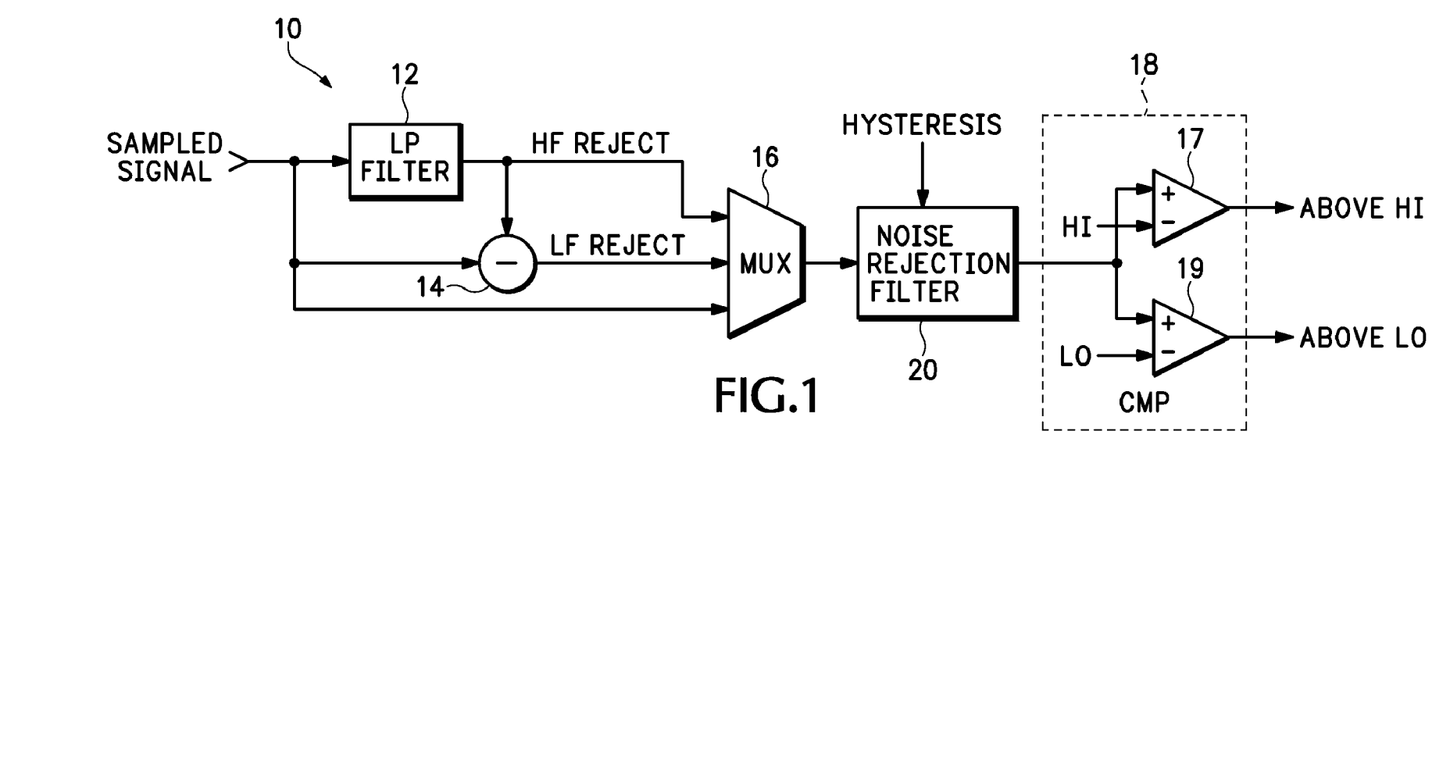
FIG. 1 is a block diagram view of a trigger circuit using a noise rejection filter according to the present invention.

Referring now to FIG. 1 a trigger circuit 10 is shown having a noise rejection filter 20 according to the present invention. For simplicity, the "front end" of a test and measurement instrument, such as an oscilloscope, is not shown. One skilled in the art will immediately realize that a probe of such a test and measurement instrument is coupled to a signal under test (SUT) to convey the SUT to an A/D (analog to digital) converter to produce signal samples. A sampled signal is input to an input filter 12 to remove high frequency (HF) signal components, producing an HF reject trigger signal. The sampled signal also is input to a subtractor 14 together with the HF reject trigger signal to produce a low frequency (LF) reject trigger signal. The sampled signal together with the HF and LF reject trigger signals are input to a multiplexer 16 to select one of them for further processing, in response to a user input selection (also not shown for simplicity). The selected trigger signal output from the multiplexer 16 is input to the noise rejection filter 20, described below, together with a hysteresis value. The noise filtered trigger signal output from the noise rejection filter 20 is input to a comparator 18 for comparison with a desired trigger level. The comparator 18 is shown here as two separate comparators 17, 19, one for comparing the output from the noise rejection filter 20 with a high trigger level and one for comparing the output from the noise rejection filter with a low trigger level. These two separate comparators 17, 19 are used for more complex trigger types that require two levels, such as runt triggers, and are not equivalent to a comparator with hysteresis as in the above-described U.S. Pat. No. 7,072,804. When only a single trigger level is needed, the levels for the two separate comparators 17, 19 are set to the same value, i.e., only one of the comparators is required and the other one may be omitted.

Figure 2:
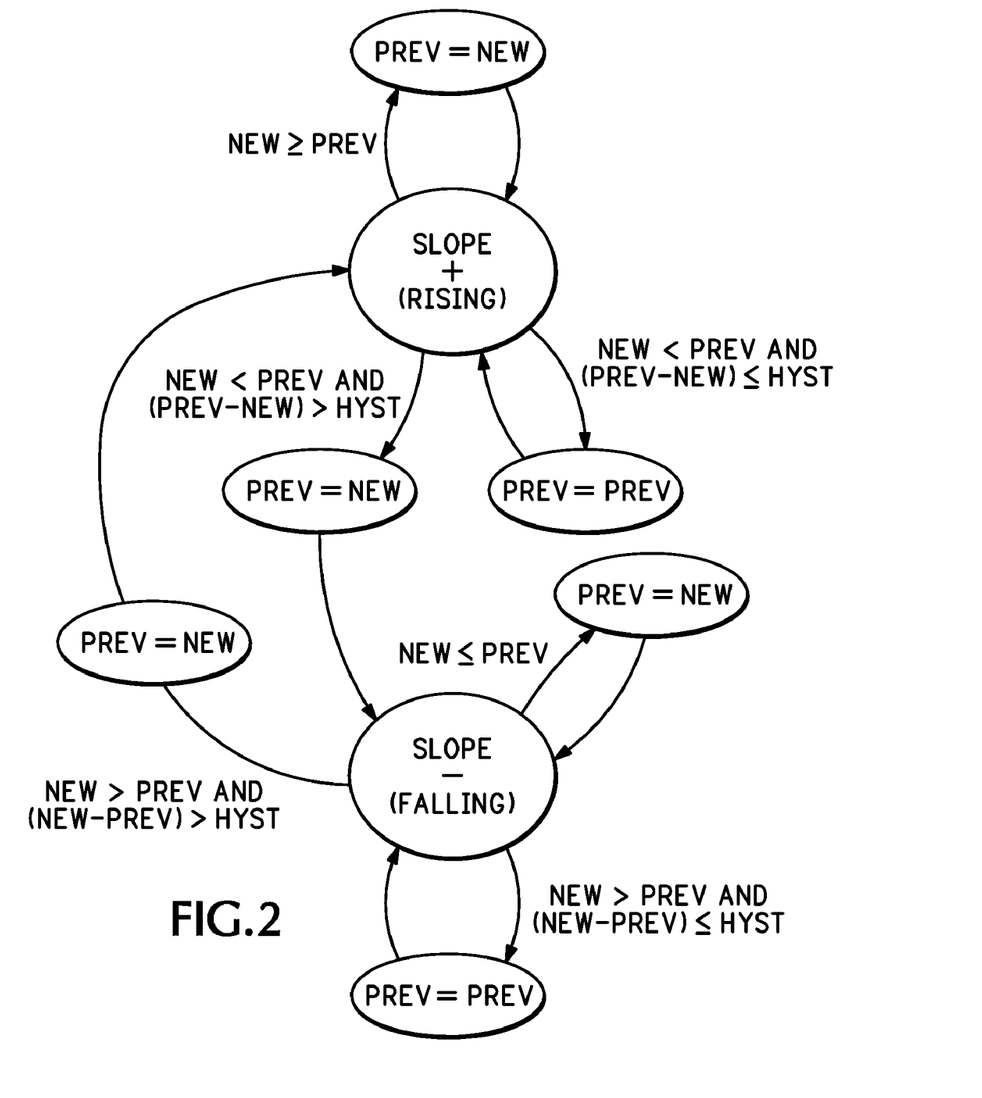
FIG. 2 is a state diagram view for the noise rejection filter of FIG. 1 according to the present invention.

The algorithm for the noise rejection filter 20, as shown by the state diagram of FIG. 2, keeps track of the slope of the input signal. The output from the noise rejection filter 20 maintains a monotonically increasing or decreasing signal until the input signal is at least a hysteresis value away in the opposite direction from the previous output of the filter, i.e., the difference between an input sample from the sampled signal and the output of the filter is at least equal to the hysteresis value in the opposite direction from the current slope. In a rising signal (a positive slope) the input of the filter 20 is compared against the output. If the input is greater than or equal to the previous output, then the output is set to the new value. If the input is less than the output but the difference is less than or equal to the hysteresis value, then the output of the filter 20 is left unaltered. If the input is less than the output by greater than the hysteresis value, then the output of the filter 20 is set to the new value and the direction of the signal is considered to have changed to falling (a negative slope).

Likewise for a falling signal if the input is less than or equal to the previous output, then the output is set to the new value. If the input is greater than the output but the difference is less than or equal to the hysteresis value, then the output of the filter 20 is left unaltered. If the input is greater than the output by greater than the hysteresis value, then the output of the filter 20 is set to the new value and the direction of the signal is considered to have changed to rising.

Figure 3:
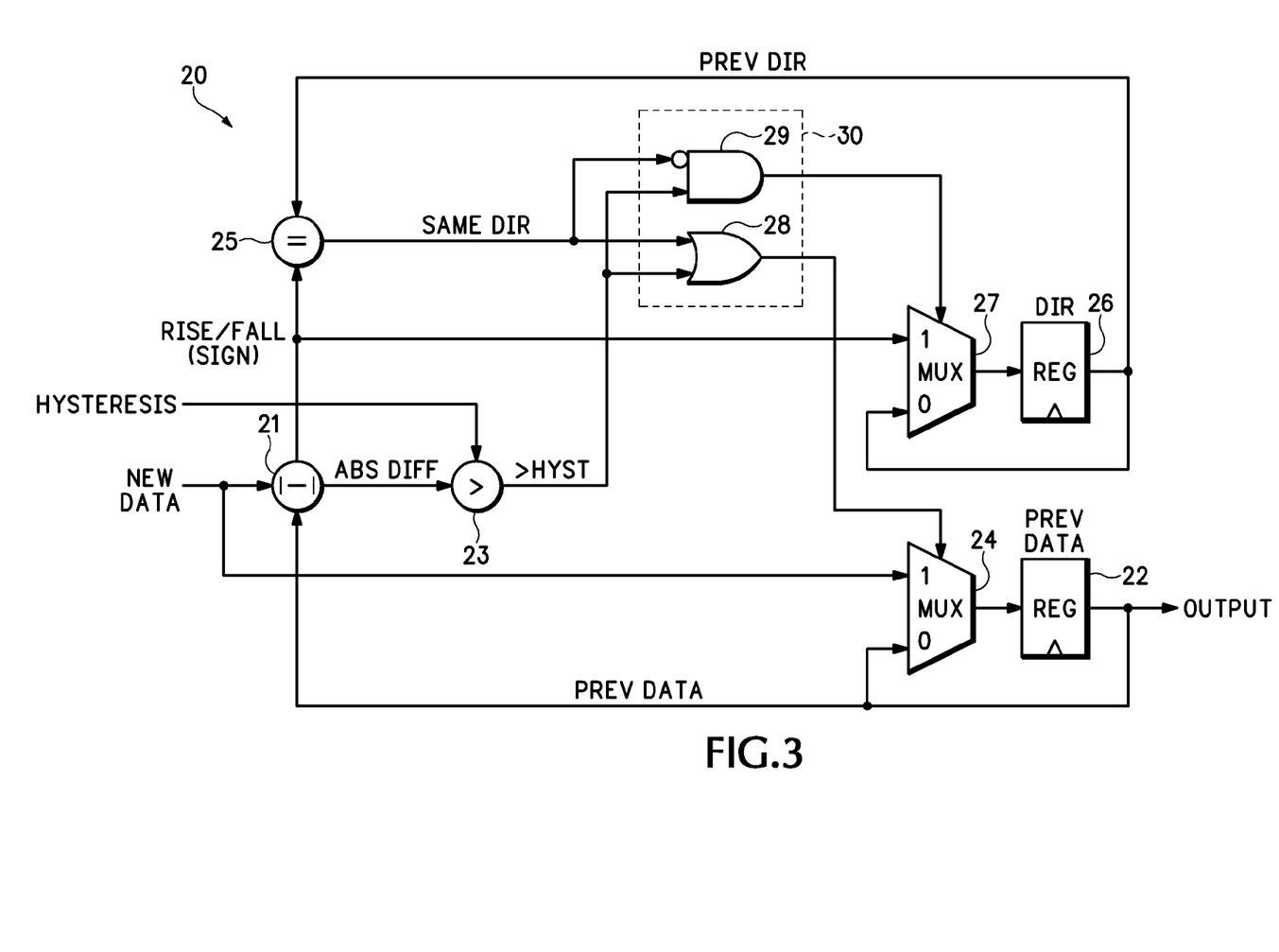
FIG. 3 is a block diagram view of a simple circuit for implementing the state diagram of FIG. 2 according to the present invention.

A simple hardware implementation of the state diagram of FIG. 2 for the noise rejection filter 20 is shown in FIG. 3. A subtractor 21 receives each data sample and compares it to the output from a previous data register 22 for the filter 20. From the sign bit of the result, a determination is made as to the slope of the sampled signal—rising or falling. The remainder of the result represents the absolute value of the difference between the two inputs to the subtractor 21, i.e., the remainder is the absolute value when the result is positive and the inverted remainder is the absolute value when the result is negative. The absolute difference is input to a comparator 23 for comparison to the hysteresis value. The new and previous samples also are input to a data multiplexer 24, the output of which is transferred to the previous data register 22 each clock cycle. The sign bit is compared (25) with the sign bit stored in a direction register 26 for equality. The sign bit and the output from the direction register 26 also are input to a direction multiplexer 27, the output of which is transferred to the direction register each clock cycle. The output from the equality comparator 25 and the hysteresis comparator 23 are input to a logic circuit 30 to generate select signals for the multiplexers 24, 27. If there is equality between the sign bit and the output from the direction register 26, the direction multiplexer 27 loads the previous direction back into the direction register. If there is inequality, then the new sign bit is loaded via the direction multiplexer 27 into the direction register 26 to indicate the new direction if the difference from the subtractor 21 is greater than the hysteresis value which sets the output of the comparator 23 high, as determined by an AND gate 29 in the logic circuit 30. The equality result and the greater than hysteresis result are input to an OR gate 28, as part of the logic circuit 30, which provides a selection signal for the data multiplexer 24. If the direction is unchanged or the absolute difference is greater than the hysteresis value, then the new data is loaded via the data multiplexer 24 into the previous data register 22. Otherwise the data multiplexer 24 loads the previous data back into the previous data register 22.

Note that the above simple circuit for the noise rejection filter 20 requires two subtracts per new data point. The first subtract (21) determines the direction of the signal and the magnitude of the change, and the second subtract (23) determines whether the magnitude of the change exceeds the hysteresis value. However for high speed digital trigger circuits, multiple data points are acquired in parallel for each clock cycle. For example if there are eight sequential data points per clock cycle, then to perform the serial process described for FIG. 3 requires sixteen subtract operations per clock cycle. The result is an unacceptably slow performance.

Figure 4:
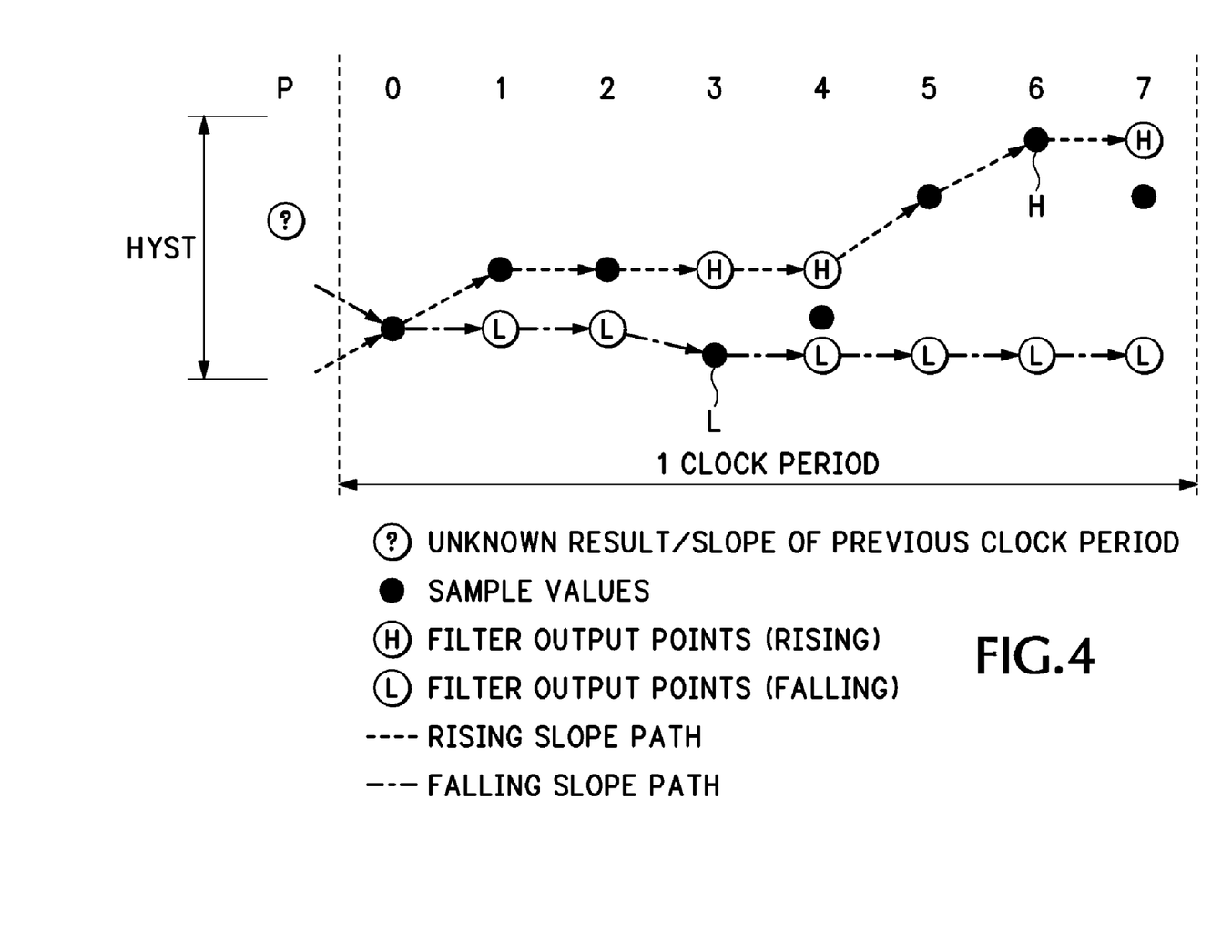
FIG. 4 is an illustrative view of sample values together with filtered values according to the present invention.

FIG. 4 shows eight samples of the sampled data signal acquired in one clock cycle—data0, data1, . . . , data7. At the left is a clear point, dataP, representing an unknown sample value and slope from the previous clock cycle at the output from the noise rejection filter 20. For each clock cycle as much calculation is done up front as possible without knowing the value and slope of dataP.

First, find all possible filter results for data7. If data7 is more than the hysteresis value away from data6, no further processing looking back is required. In fact if there is a large direction change (at least equal to the hysteresis value) anywhere within data0-data7, dataP does not need to be considered. However if all of the data points data0-data7 are within the hysteresis value of each other as shown, then the value and slope of dataP are required. If all the data points are within the hysteresis value of dataP, then the previous slope is maintained. For a rising slope the output of the filter 20 for the present clock cycle is max(dataP, data 0, . . . , data7). The max of data0 through data7 may be precomputed and is shown as the value H (in this example determined by data6). Therefore if all of the data points are within the hysteresis value apart, the result of the filter is max(dataP,H). Likewise for the falling slope the output of the filter is min(dataP, data0, . . . , data7) or min(dataP, L), where L in this example is determined by data3.

Although all of the data points within the clock cycle may be within the hysteresis value of each other, some of them may be more than the hysteresis value away from dataP. For example if the value of dataP is above the data points shown, has a rising slope and is more than the hysteresis value from data3, then data0, data1 and data2 will be held at the dataP level. However data3-data7 follow the falling slope line since data3 is a change in direction from dataP to a falling slope.

Figure 5:
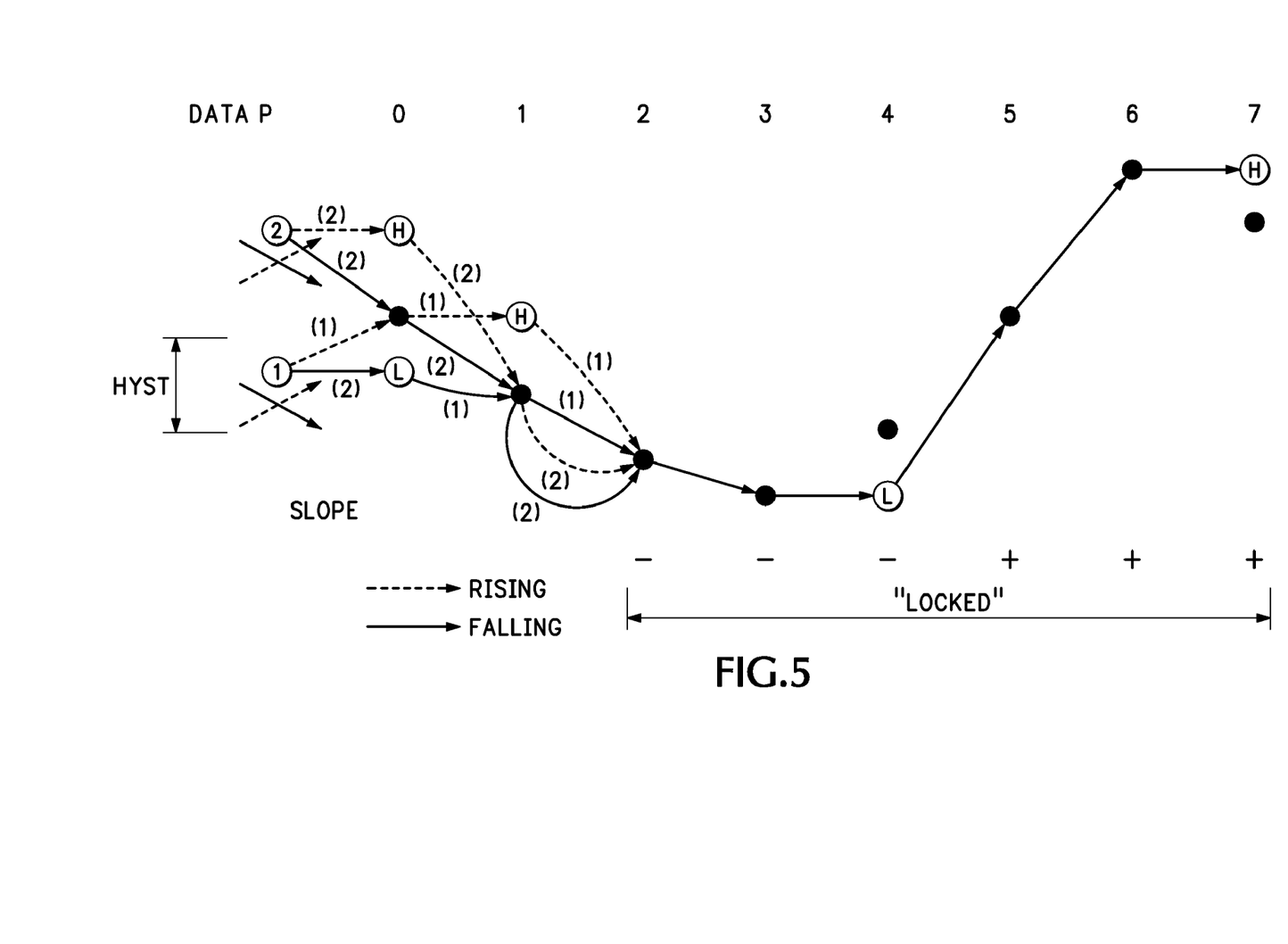
FIG. 5 is an illustrative view of sample values together with filtered values showing a change in slope direction within a group of samples according to the present invention.

To implement this design, either in hardware or in software using a data processor, the problem is broken into two parts. The first part of the filter circuit 20 figures out, or pre-computes, all possible answers for each point within the group of eight samples to determine a maximum value, H, a minimum value L, and identifies all differences between samples within the group that are at least equal to the hysteresis value. Referring now to FIG. 5, if there is a direction change within the group of eight samples, then each subsequent point is determined without referring back to samples in the previous clock cycle. As shown, it is determined that, due to the hysteresis difference between data0 and data2, the slope at data2 is negative, but at data5, due to the hysteresis difference between data3 and data5, the slope becomes positive. Therefore, there is a direction change within the eight samples and the values for points corresponding to data2-data7 are set without reference to the direction or value of dataP, i.e., these subsequent points are "locked" and are not altered later. However, where there are no direction changes, as in FIG. 4 where H−L≦HYST, then the points are determined based upon the direction and value of dataP, the last point in the previous clock cycle. Depending upon the outcome of the previous clock cycle, each point has three possible output values—the maximum of all earlier points in the current clock period (for a rising signal), the minimum of all earlier points in the current clock period (for a falling signal), or dataP if it is the highest point in a rising signal or the lowest point in a falling signal.

The second part of the filter circuit 20 selects which output to use for all non-"locked" points, i.e., the earlier points in the group before the direction change. The outputs are determined from the value and slope of dataP. The waveform slope is determined for each point—equal to the previous slope unless one of the earlier points in this clock cycle is more than the hysteresis value away from dataP. Once the direction of the slope is determined, the output from the filter circuit 20 is the maximum of dataP and the local high (H) for rising slopes, or the minimum of dataP and the local low (L) for falling slopes. For illustration in FIG. 5 there are two different dataP points, (1) and (2), with the slope indicated by either a dotted line (rising) or solid line (falling). The resulting values for data0 and data1, respectively, relative either to dataP(1) or dataP(2) and the appropriate slope are shown. Implementation of this high speed circuit is well within the competence of one of ordinary skill in the art based upon the above description.

Figure 6:
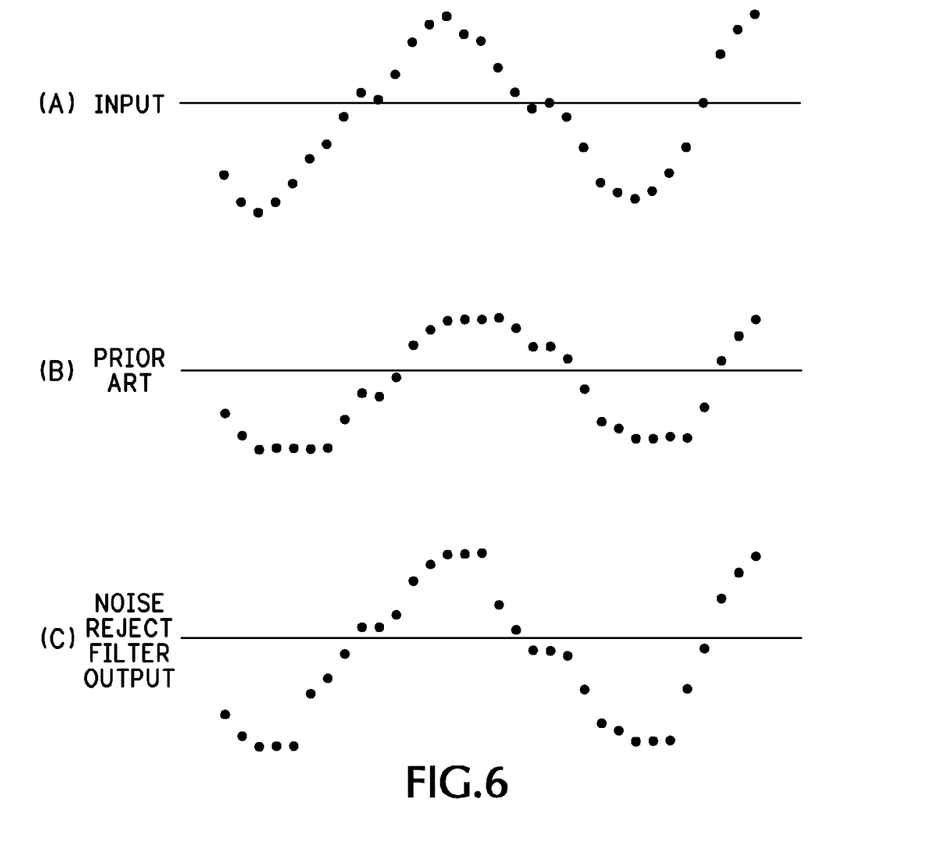
FIG. 6 is a graphic view for comparing (a) input samples with (b) a prior art filtered result and with (c) a filtered result according to the present invention.
Figure 7:
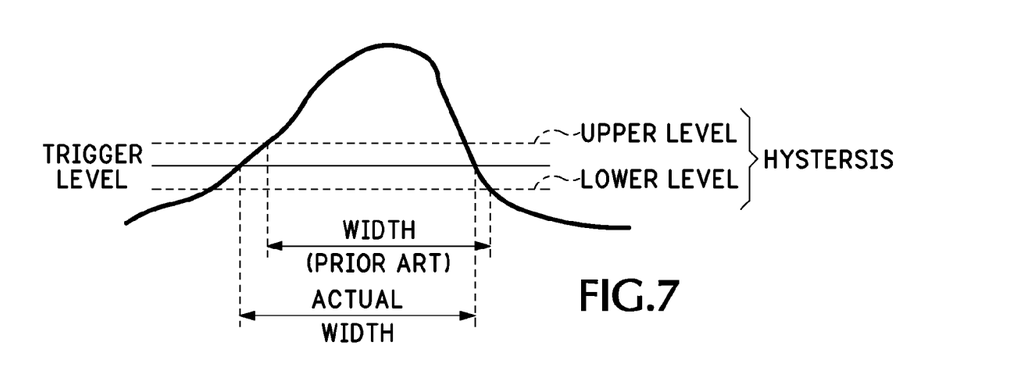
FIG. 7 is a graphic view illustrating the effect of hysteresis applied in a comparator on the pulse width of a signal at a desired trigger level as opposed to noise rejection filtering prior to the comparator according to the present invention.

FIG. 6 shows a comparison between (A) an input sampled signal, (B) a filtered sampled signal according to the article by Driessche et al described above, and (C) a filtered sampled signal according to the noise rejection filter 20 described above. As is readily apparent, the tops of the (B) signal have been "knocked off" (i.e., removed) when compared to the input sampled signal (A), while the (C) signal preserves the tops of the input sampled signal. Also, FIG. 7 shows the possible effect on determining signal pulse width using a comparator with hysteresis according to the above-described prior art, U.S. Pat. No. 7,072,804, versus using pre-filtering for hysteresis before the comparator according to the present invention.

Thus, the present invention provides a noise rejection filter that may be used in a trigger circuit which preserves the peaks of the input sampled signal as well as the pulse width at a desired trigger level by monotonically changing the value of the filter output for each sample point so long as the value is changing in the same direction as the current signal slope, preserving the value for each sample point as long as any difference between the filter output and the new sample value in the opposite direction is less than or equal to the hysteresis value, and changing the slope when the difference between the filter output and the new sample value in the opposite direction is greater than the hysteresis value while updating the output from the filter with the new sample value.

What is claimed is:

1. A method of filtering a sequence of sample points representing an input sampled signal comprising the steps of:
   updating a filter output monotonically with consecutive sample point values so long as a signal slope determined from consecutive sample points remains unchanged;
   maintaining the filter output at a constant level when the signal slope changes but a difference between the sample point value and the filter output is less than a hysteresis value; and
   changing the signal slope while updating the filter output with the sample point value when the signal slope changes and the difference is greater than the hysteresis value.

2. The method as recited in claim 1 wherein the signal slope determination comprises the step of sequentially comparing each sample point value with the filtered output to determine a direction of the signal slope at the sample point.

3. A noise rejection filter comprising:
   means for determining a slope direction for each sample point in a sequence of sample points representing an input sampled signal;
   means for determining a difference value between a filtered output value for the noise rejection filter and a sample value for each sample point;
   means for replacing the filtered output value with the sample value when the slope direction is unchanged; and
   means for updating the slope direction and replacing the filtered output value with the sample value when the slope direction changes and the difference value is greater than a hysteresis value.

4. The filter as recited in claim 3 wherein the determining means comprises means for sequentially comparing each sample point value with the filtered output to determine the slope direction at the sample point.

5. A trigger circuit comprising:
   means for selecting a sampled trigger signal derived from a sampled input signal;
   means for noise rejection filtering the sampled trigger signal using a hysteresis value wherein peaks of the sampled trigger signal are preserved to produce a filtered trigger signal; and
   means for comparing the filtered trigger signal with a desired trigger level to produce a trigger output.

6. The trigger circuit as recited in claim 5 wherein the noise rejection filtering means comprises:
   means for determining a slope direction for each sample point in a sequence of sample points representing the sampled trigger signal;
   means for determining a difference value between a current filtered trigger signal value and a sample value for each sample point;
   means for replacing the current filtered trigger signal value with the sample value when the slope direction is unchanged, or when the slope direction changes to an opposite direction and the difference value is greater than a hysteresis value.

7. The trigger circuit as recited in claim 6 wherein the determining means comprises means for sequentially comparing each sample point value with the filtered output to determine the slope direction at the sample point.

8. A digital trigger circuit comprising:
a low pass filter receiving samples representative of an input signal and developing high frequency reject signal samples at an output;
a subtractor receiving said samples representative of said input signal at a first input and said high frequency reject signal samples at a second input, and developing low frequency reject signal samples at an output;
a multiplexer receiving said samples representative of said input signal at a first input, receiving said high frequency reject samples at a second input, and receiving said low frequency signal samples at a third input, and selecting therefrom a sampled trigger signal in response to user input;
a noise rejection filter filtering said sampled trigger signal using a hysteresis value wherein peaks of said sampled trigger signal are preserved and producing a filtered trigger signal at an output; and
a comparator receiving said filtered trigger signal and comparing said filtered trigger signal to a predetermined trigger level to produce a trigger output signal, said comparator not employing hysteresis.

9. A digital noise rejection filter, comprising:
an input for receiving a digital representation of an input signal;
circuitry receiving said digital representation of said input signal, determining a rising or falling direction of said input signal, storing an indication of said direction, developing a filtered output signal at an output of said digital noise rejection filter, and storing the value of said output signal;
when said noise rejection filter compares a generally rising signal at said input of said filter against said output signal, said stored value of output signal is set to the current value of said input signal when said current value is greater in amplitude than said stored value of the previous output signal,
said stored value of said output signal is not altered when said current value is less than said amplitude of said previous output signal, wherein the difference is less than a predetermined hysteresis amount; and
said stored value of said output signal is set to the current value of said input signal and said stored direction of said input signal is changed to indicate a generally falling input signal when said current value is lower in amplitude than said stored value of said previous output signal by more than said predetermined hysteresis amount.

10. A digital noise rejection filter, comprising:
an input for receiving a digital representation of an input signal;
circuitry receiving said digital representation of said input signal, determining a rising or falling direction of said input signal, storing an indication of said direction, developing a filtered output signal at an output of said digital noise rejection filter, and storing the value of said output signal;
when said noise rejection filter compares a generally falling signal at said input of said filter against said output signal, said stored value of output signal is set to the current value of said input signal when said current value is lower in amplitude than said stored value of the previous output signal,
said stored value of said output signal is not altered when said current value is greater than said amplitude of said previous output signal, wherein the difference is less than a predetermined hysteresis amount; and
said stored value of said output signal is set to the current value of said input signal and said stored direction of said input signal is changed to indicate a generally rising input signal when said current value is greater in amplitude than said stored value of said previous output signal by more than said predetermined hysteresis amount.

* * * * *